(12) United States Patent
Won et al.

(10) Patent No.: US 11,874,104 B2
(45) Date of Patent: Jan. 16, 2024

(54) APPARATUS FOR TRANSFERRING OPTICAL INSTRUMENT

(71) Applicant: AUROS TECHNOLOGY, INC., Hwaseong-si (KR)

(72) Inventors: Dea Kyung Won, Hwaseong-si (KR); So Yeon Yoon, Osan-si (KR)

(73) Assignee: AUROS TECHNOLOGY, INC., Hwaseong-si (KR)

( * ) Notice: Subject to any disclaimer, the term of this patent is extended or adjusted under 35 U.S.C. 154(b) by 0 days.

(21) Appl. No.: 18/270,083

(22) PCT Filed: Sep. 28, 2022

(86) PCT No.: PCT/KR2022/014529
§ 371 (c)(1),
(2) Date: Jun. 28, 2023

(87) PCT Pub. No.: WO2023/177032
PCT Pub. Date: Sep. 21, 2023

(65) Prior Publication Data
US 2023/0392926 A1    Dec. 7, 2023

(30) Foreign Application Priority Data

Mar. 14, 2022   (KR) ......................... 10-2022-0031205

(51) Int. Cl.
*G01B 11/27*   (2006.01)

(52) U.S. Cl.
CPC .................................. *G01B 11/272* (2013.01)

(58) Field of Classification Search
CPC ..... G01B 11/272; G01B 21/88; G01N 21/956
(Continued)

(56) References Cited

U.S. PATENT DOCUMENTS

| | | | |
|---|---|---|---|
| 7,372,231 B2 * | 5/2008 | Sako | G05B 19/19 318/632 |
| 2005/0174466 A1 | 8/2005 | Tanaka et al. | |
| 2010/0223767 A1 | 9/2010 | Vianen et al. | |

FOREIGN PATENT DOCUMENTS

| | | |
|---|---|---|
| CN | 209431013 U | 9/2019 |
| JP | H06-324737 A | 11/1994 |

(Continued)

OTHER PUBLICATIONS

Korean Office Action for related KR Application No. 10-2022-0031205 dated Dec. 21, 2022 from Korean Intellectual Property Office.

(Continued)

*Primary Examiner* — Georgia Y Epps
*Assistant Examiner* — Mai Thi Ngoc Tran
(74) *Attorney, Agent, or Firm* — Paratus Law Group, PLLC

(57) ABSTRACT

An apparatus for transferring an optical instrument, includes: a transferring block, wherein the optical instrument is coupled to a front surface thereof; a fixed block disposed at a rear side of the transferring block and coupled to a granite surface plate; a wedge stage module disposed on the fixed block to move the transferring block in a vertical direction; a vertical guide disposed at a side end of the transferring block to guide the transferring block in the vertical direction; and a horizontal stage module connected between the wedge stage module and the transferring block to guide a movement in a horizontal direction.

24 Claims, 12 Drawing Sheets

(58) Field of Classification Search
USPC .......................................................... 250/221
See application file for complete search history.

(56) References Cited

FOREIGN PATENT DOCUMENTS

| | | |
|---|---|---|
| JP | 2004-047852 A | 2/2004 |
| JP | 2004-152917 A | 5/2004 |
| JP | 2011-064461 A | 3/2011 |
| JP | 2015-011005 A | 1/2015 |
| KR | 10-1027472 B1 | 4/2011 |
| KR | 10-2012-0138258 A | 12/2012 |
| TW | 200739667 A | 10/2007 |
| WO | WO 02/091436 A1 | 11/2002 |

OTHER PUBLICATIONS

Korean Notice of Allowance for related KR Application No. 10-2022-0031205 dated Apr. 26, 2023 from Korean Intellectual Property Office.

Taiwanese Notice of Allowance for related TW Application No. 111138505 dated Oct. 2, 2023 from Taiwan Intellectual Property Office.

\* cited by examiner ical instrument, and more particularly to, an apparatus for transferring an optical instrument to precisely move the optical instrument for measurement or inspection.
APPARATUS FOR TRANSFERRING OPTICAL INSTRUMENT

CROSS-REFERENCE TO PRIOR APPLICATIONS

This Application is a National Stage Application of PCT International Application No. PCT/KR2022/014529 (filed on Sep. 28, 2022), which claims priority to Korean Patent Application No. 10-2022-0031205 (filed on Mar. 14, 2022), which are all hereby incorporated by reference in their entirety.

BACKGROUND

The present invention relates to an apparatus for transferring an optical instrument, and more particularly to, an apparatus for transferring an optical instrument to precisely move the optical instrument for measurement or inspection.

To manufacture semiconductors, a process of sequentially forming a pattern on a wafer is continuously performed while repeating processes of deposition, exposure (photo lithography), and etching. When these numerous layers are stacked, each pattern needs to be accurately stacked at a required position so that no defects occur and the semiconductor can operate normally.

In an exposure process of forming a pattern on a wafer using an exposure machine, an overlay measurement is a process that uses an optical instrument to measure whether a pattern of a previous process and a pattern formed in a current process are correctly aligned and connected as designed.

Due to the diversification of semiconductor processes and the increasing degree of integration, the thickness of wafers is diversifying. To cope with this, an overlay measurement device may adjust a height to match the thickness of the wafer by moving a chuck with the wafer in a vertical direction or the optical instrument in the vertical direction.

However, a method of vertically moving the chuck with the wafer may cause problems in repeatability of the flatness of the chuck. Therefore, a method of moving the optical instrument using a transferring apparatus fixed to a granite surface plate has recently been developed.

However, when a distance between the optical instrument and the granite surface plate increases due to the transferring apparatus, the safety and accuracy of the optical instrument may be degraded. Additionally, since the transferring apparatus has to support all the weight to move the optical instrument, there is a problem in that an excessive load is applied to a motor.

SUMMARY

The present invention is directed to providing an apparatus for transferring an optical instrument with a structure that is slimmed down.

Also, the present invention is directed to providing an apparatus for transferring an optical instrument that minimizes a moving load.

The technical problems of the present invention are not limited to the aforementioned technical problems, and other technical problems, which are not mentioned above, may be clearly understood by those skilled in the art from the following descriptions.

In order to achieve the above objects, an apparatus for transferring an optical instrument according to an embodiment of the present invention includes: a transferring block, wherein the optical instrument is coupled to a front surface thereof; a fixed block disposed at a rear side of the transferring block and coupled to a granite surface plate; a wedge stage module disposed on the fixed block to move the transferring block in a vertical direction; a vertical guide disposed at a side end of the transferring block to guide the transferring block in the vertical direction; and a horizontal stage module connected between the wedge stage module and the transferring block to guide a movement in a horizontal direction.

Detailed matters of other embodiments are included in the detailed description and drawings.

According to an apparatus for transferring an optical instrument of the present invention, one or more effects will be described below.

First, a pair of ball nut blocks that are symmetrically disposed move closer to or further away from each other and a wedge block moves in a vertical direction so that a force in a driving direction is offset from each other and only a force in the vertical direction is transmitted to a transferring block.

Second, a 'V' shaped wedge block has the advantage of increasing accuracy and reducing a load on a motor due to a weight of the optical instrument.

Third, as driving and guiding mechanical elements for moving the optical instrument are properly disposed and slimmed down, there are advantages in minimizing a distance between the optical instrument and a granite surface plate, which increases safety and accuracy.

Fourth, it also has the advantage of increasing measurement accuracy by having 2 degrees of freedom in the horizontal direction so that a force is transmitted only in the vertical direction to the optical instrument.

The effects of the present invention are not limited to the aforementioned effects, and other effects, which are not mentioned above, will be clearly understood by those skilled in the art from the claims.

DETAILED DESCRIPTION

Figure 1:
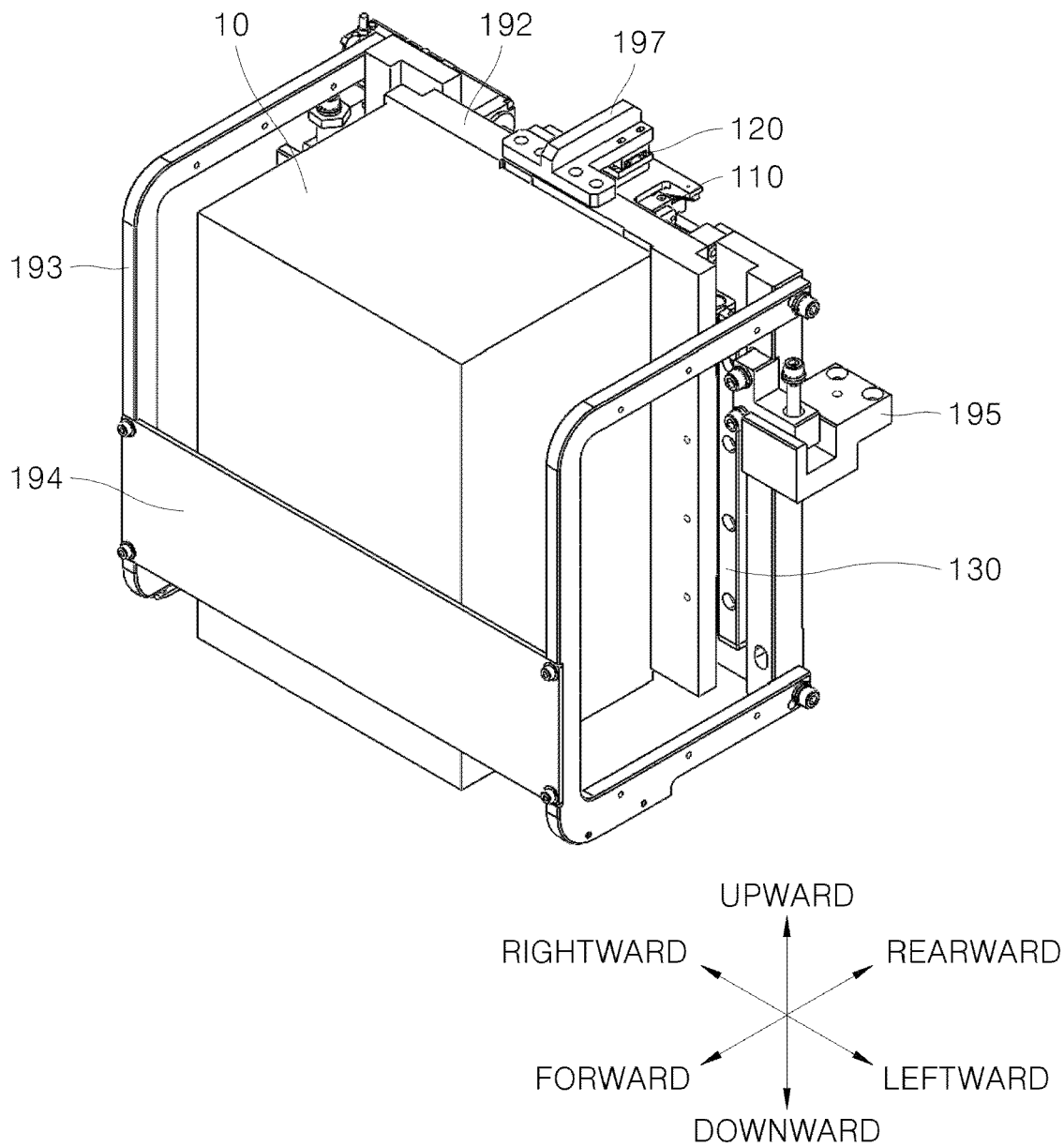
FIG. 1 is a perspective view of an apparatus for transferring an optical instrument according to an embodiment of the present invention.

Advantages and features of the present invention and methods of achieving the advantages and features will be clear with reference to embodiments described in detail below together with the accompanying drawings. However, the present invention is not limited to the embodiments disclosed herein but will be implemented in various forms. The embodiments of the present invention are provided so that the present invention is completely disclosed, and a person with ordinary skill in the art can fully understand the scope of the present invention. The present invention will be defined only by the scope of the appended claims. Throughout the specification, the same reference numerals denote the same constituent elements.

Terms "first", "second", and the like may be used to describe various constituent elements, but the constituent elements are of course not limited by these terms. These terms are used merely to distinguish one constituent element from another constituent element, the first constituent element may, of course, be the second constituent element, unless explicitly described to the contrary.

Throughout the specification, unless explicitly described to the contrary, each constituent element may be singular or plural. Hereafter, any configuration is disposed "at an upper portion (or a lower portion)" of a constituent element or "above (or below)" a constituent element, which may mean not only that any configuration is disposed in contact with an upper surface (or a lower surface) of the constituent element, but also that other configurations may be interposed between the constituent element and any configuration disposed on above (or below) the constituent element.

In addition, when one constituent element is described as being "connected", "coupled", or "attached" to another constituent element, it should be understood that one constituent element can be connected or attached directly to another constituent element, and other constituent elements may be "interposed" between each constituent element, or that each constituent element may be "connected," "coupled," or " attached" through other constituent elements.

Singular expressions used in the present specification include plural expressions unless clearly described as different meanings in the context. It should not be interpreted that the terms "comprises," "comprising," "includes" and/or "including," used herein necessarily include all of the several constituent elements or several steps disclosed in the present specification, and it should be interpreted that the terms do not include some of the constituent elements or steps and may further include additional constituent elements or steps.

Throughout the specification, when referring to "A and/or B", it means A, B, or A and B, unless explicitly described to the contrary, and when referring to "C to D", it means C or more and D or less, unless explicitly described to the contrary.

Hereinafter, the present invention will be described with reference to the accompanying drawings to describe an apparatus for transferring an optical instrument according to embodiments of the present invention.

Figure 2:
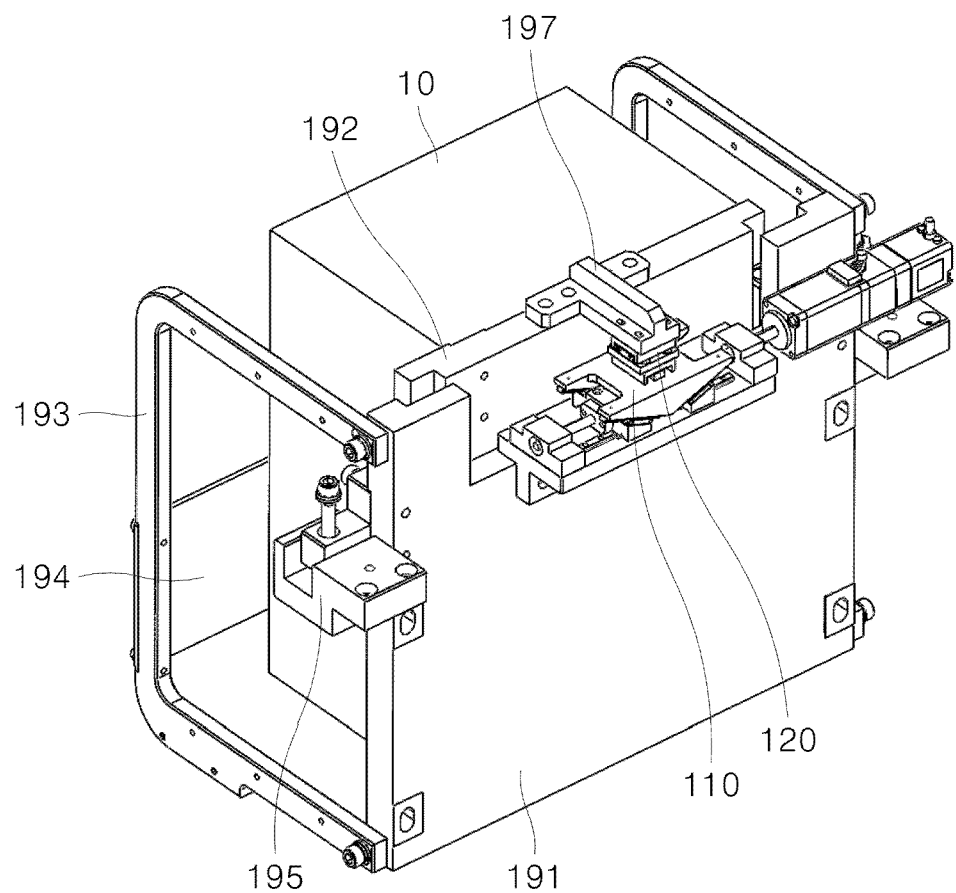
FIG. 2 is a perspective view of the apparatus for transferring the optical instrument illustrated in FIG. 1 when viewed from a different direction.
Figure 2:
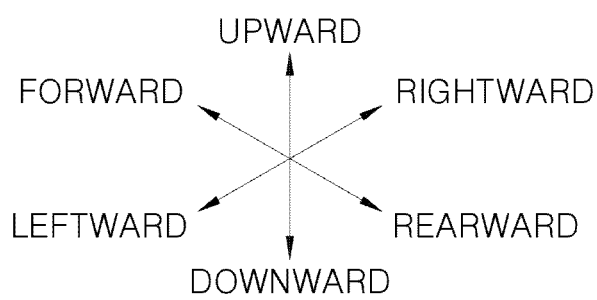
Figure 3:
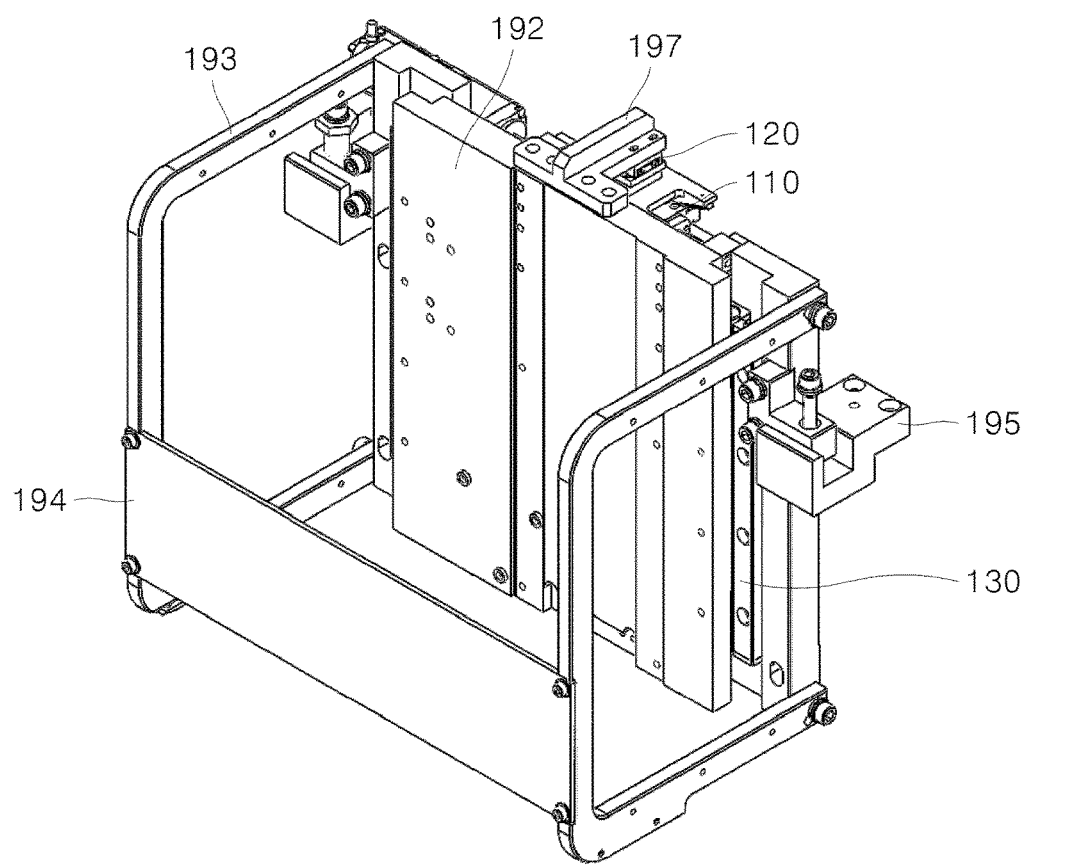
FIG. 3 is a perspective view of the apparatus for transferring the optical instrument illustrated in FIG. 1, excluding the optical instrument.
Figure 3:
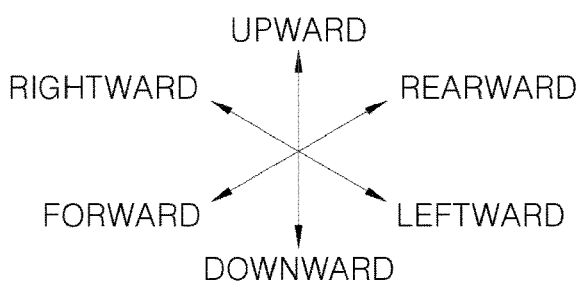
Figure 4:
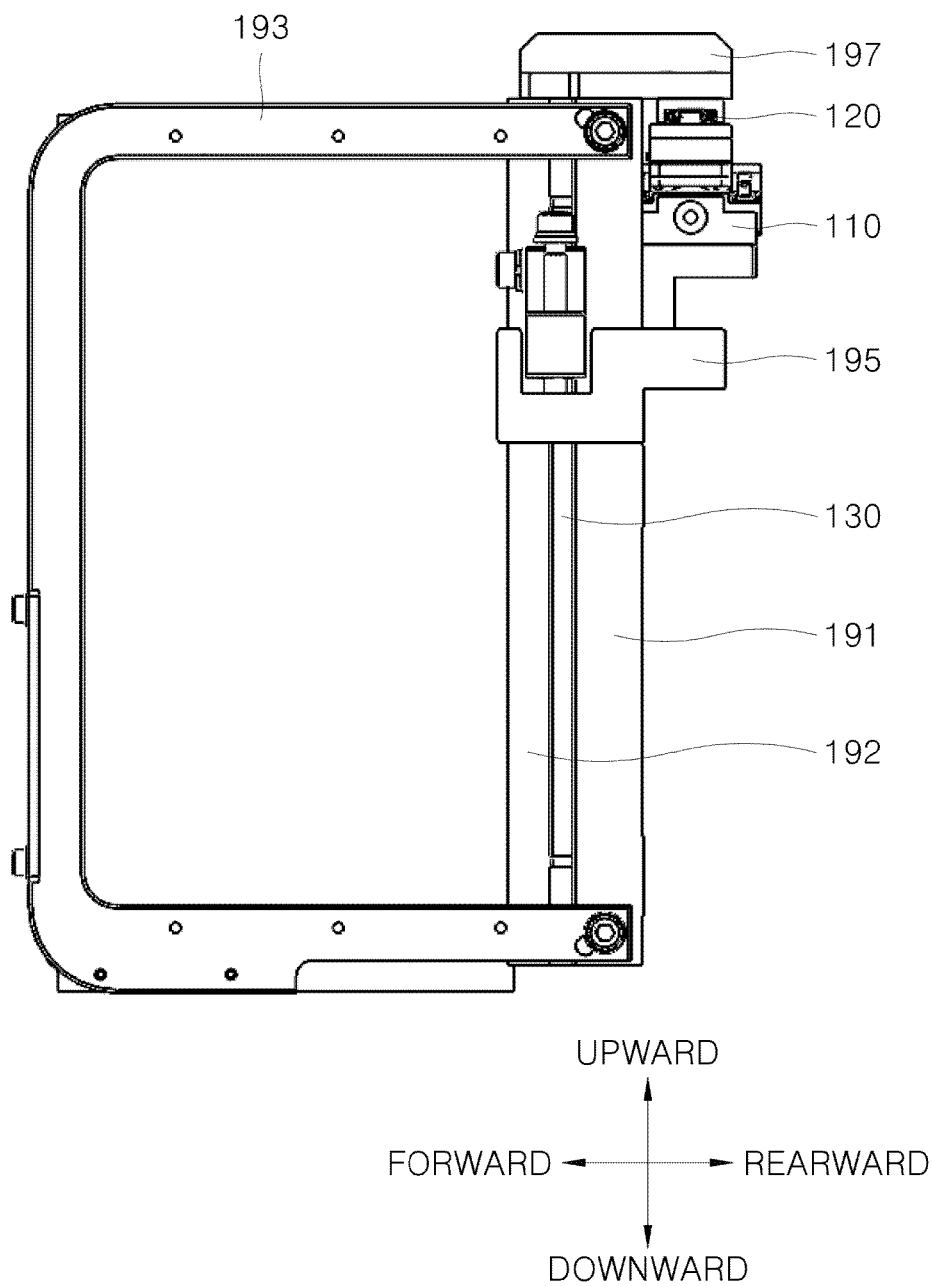
FIG. 4 is a side view of the apparatus for transferring the optical instrument illustrated in FIG. 1.
Figure 5:
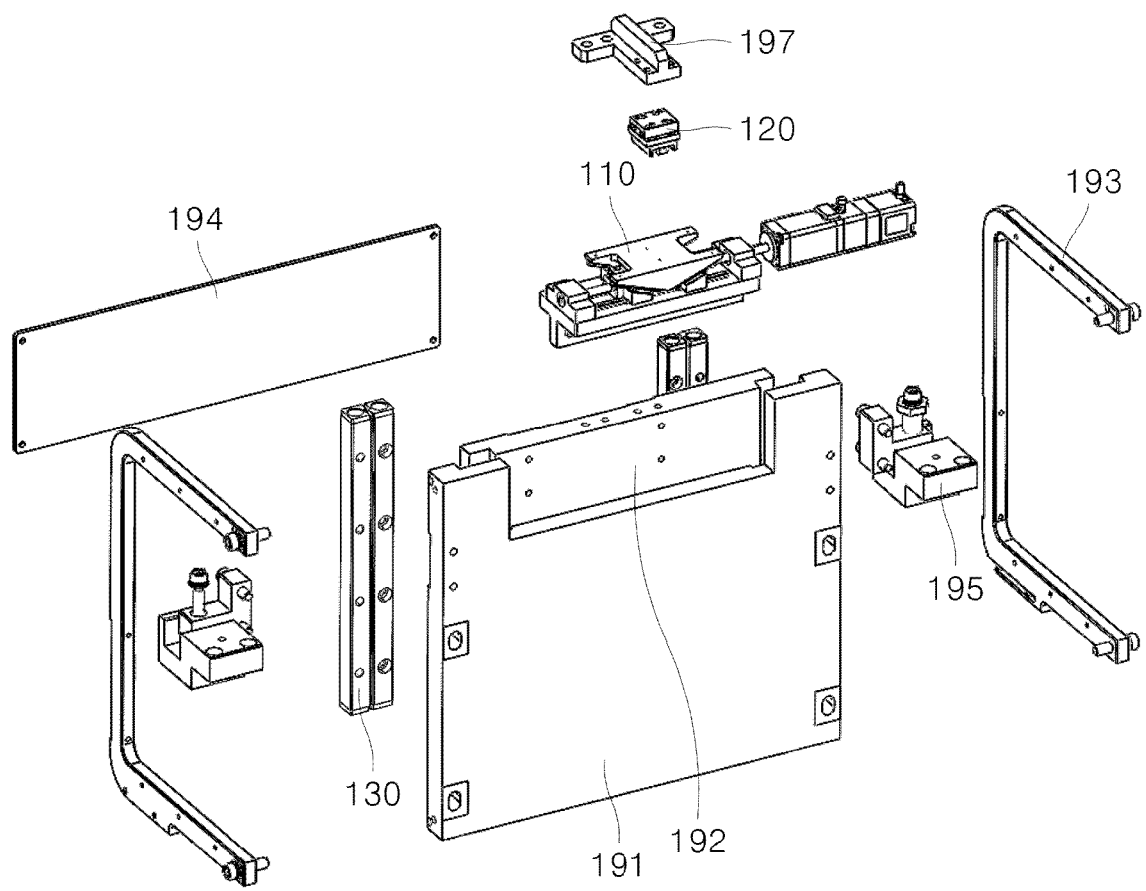
FIG. 5 is an exploded perspective view of the apparatus for transferring the optical instrument illustrated in FIG. 1.
Figure 5:
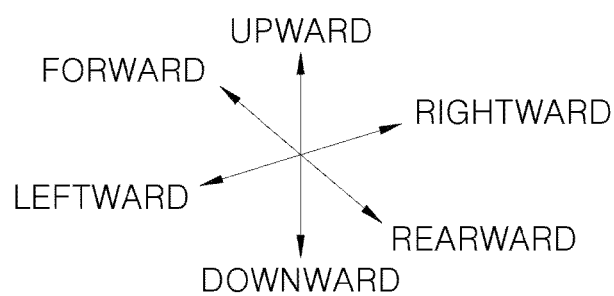

FIG. 1 is a perspective view of an apparatus for transferring an optical instrument according to an embodiment of the present invention, FIG. 2 is a perspective view of the apparatus for transferring the optical instrument illustrated in FIG. 1 when viewed from a different direction, FIG. 3 is a perspective view of the apparatus for transferring the optical instrument illustrated in FIG. 1, excluding the optical instrument, FIG. 4 is a side view of the apparatus for transferring the optical instrument illustrated in FIG. 1, and FIG. 5 is an exploded perspective view of the apparatus for transferring the optical instrument illustrated in FIG. 1.

The apparatus for transferring the optical instrument according to the embodiment of the present invention includes a transferring block 192, wherein an optical instrument 10 is coupled to a front surface thereof and having an upright plate shape, a fixed block 191 disposed at a rear side of the transferring block 192, coupled to a granite surface plate (not illustrated), and having an upright plate shape, a wedge stage module 110 disposed on the fixed block 191 to move the transferring block 192 in the vertical direction, a vertical guide 130 disposed at a side end of the transferring block 192 to guide the transferring block 192 in the vertical direction, and a horizontal stage module 120 connected between the wedge stage module 110 and the transferring block 192 to guide a movement in the horizontal direction.

The transferring block 192 is formed in the shape of a plate and disposed upright. The transferring block 192 supports the optical instrument 10 by fixing the optical instrument 10 to the front surface. The transferring block 192 is movably disposed in the vertical direction in front of the fixed block 191.

The left and right ends of the transferring block 192 are connected to the fixed block 191 by a pair of vertical guides 130. The pair of vertical guides 130 are coupled to the rear surfaces of both ends of the transferring block 192, respectively. The transferring block 192 has a vertically elongated step formed to be in close contact with the vertical guide 130 on at least two surfaces.

The transferring block 192 moves in the vertical direction by the wedge stage module 110. The transferring block 192 is connected to the horizontal stage module 120 by a block connector 197. The block connector 197 is coupled to an upper end of the transferring block 192.

The block connector 197 is coupled to the upper end of the transferring block 192 and is disposed to protrude rearward. The block connector 197 has a T-shape substantially. A portion of the block connector 197 disposed in leftward and rightward directions is coupled to the upper end of the transferring block 192.

A portion of the block connector 197 disposed in forward and rearward directions is coupled to an upper end of the horizontal stage module 120. The block connector 197 moves in the vertical direction by the wedge stage module 110 to move the transferring block 192.

The fixed block 191 is formed in the shape of a plate and disposed upright. The fixed block 191 is disposed at a rear side of the transferring block 192. The fixed block 191 of the plate shape is disposed so that a surface thereof faces the transferring block 192 of the plate shape. The fixed block 191 is disposed so that the front surface thereof faces a rear surface of the transferring block 192.

The fixed block 191 is connected to the transferring block 192 by the pair of vertical guides 130 on both left and right sides. The pair of vertical guides 130 are coupled to both front surfaces of the fixed block 191, respectively. The fixed block 191 has a vertically elongated step formed to be in close contact with the vertical guide 130 on at least two surfaces.

The fixed block 191 is connected to the granite surface plate (not illustrated) by a pair of granite surface plate connectors 195. The fixed block 191 is connected to the pair of granite surface plate connectors 195 on both ends thereof, respectively. The pair of granite surface plate connectors 195 are coupled to both ends of the fixed block 191, respectively. The granite surface plate connectors 195 are fixed in close contact with the front and side surfaces of the fixed block 191. The granite surface plate connector 195 protrudes rearward and is coupled to an upper surface of the granite surface plate. The granite surface plate connector 195 is provided with a bolt that may adjust the level of the fixed block 191 in the vertical direction.

The fixed block 191 is coupled and fixed to the granite surface plate. The granite surface plate is disposed at a rear side of the fixed block 191 to support the fixed block 191.

The wedge stage module 110 is disposed at an upper end of the fixed block 191. A center portion of the upper end of the fixed block 191 is recessed downward to couple the wedge stage module 110 to the recessed portion.

A pair of side covers 193 are coupled to both ends of the fixed block 191, respectively. The pair of side covers 193 are coupled to both ends of the fixed block 191, respectively. Each of the pair of side covers 193 is formed in a "C" shape and disposed to protrude forward. The pair of side covers 193 are disposed to be spaced apart from both side surfaces of the optical instrument 10, respectively, to protect the optical instrument 10.

A front cover 194 is coupled to front ends of the pair of side covers 193. The front cover 194 is coupled to the front ends of the pair of side covers 193 and disposed to be spaced apart from the optical instrument 10. The front cover 194 protects the optical instrument 10.

The wedge stage module 110 is coupled to the recessed portion of the upper end of the fixed block 191 and disposed at the rear side of the fixed block 191. The wedge stage module 110 has a step formed at a lower end thereof to be in close contact with the fixed block 191 on at least two surfaces. The wedge stage module 110 is disposed at an upper side of the granite surface plate.

The wedge stage module 110 is connected to the transferring block 192 to move the transferring block 192 in the vertical direction. The wedge stage module 110 is a motorized stage that moves the transferring block 192 in the vertical direction, and is provided with two wedges to enable precise movement and minimize a motorized load. The upper end of the wedge stage module 110 is coupled to the horizontal stage module 120.

A detailed description of the wedge stage module 110 will be described below with reference to FIGS. 6 and 7.

The horizontal stage module 120 guides the transferring block 192 in two mutually orthogonal axes. The horizontal stage module 120 is configured with two horizontal stages coupled such that guiding directions are orthogonal. The horizontal stage module 120 guides the transferring block 192 in the forward and rearward directions and the leftward and rightward directions. The horizontal stage module 120 is connected between the transferring block 192 and the wedge stage module 110 to give the transferring block 192 degrees of freedom in the forward and rearward directions and the leftward and rightward directions.

When the transferring block 192 equipped with the optical instrument 10 moves in the vertical direction, the transferring block 192 may move in the horizontal direction, or rotate about an axis in the horizontal or vertical direction, by a repulsive force, a thrust, or a vibration generated by the vertical guide 130 and/or the wedge stage module 110. When the transferring block 192 moves or rotates in the horizontal direction, the optical instrument 10 is not capable of making accurate measurements. The horizontal stage module 120 offsets a force that rotates the transferring block 192 or moves the transferring block 192 in the horizontal direction so that the transferring block 192 may move only in the vertical direction.

The horizontal stage module 120 is disposed at the rear side of the transferring block 192. A lower end of the horizontal stage module 120 is coupled to the wedge stage module 110. An upper end of the horizontal stage module 120 is coupled to a lower side of the protruding portion of the block connector 197. The horizontal stage module 120 is connected to the transferring block 192 by the block connector 197.

A detailed description of the horizontal stage module 120 will be described below with reference to FIGS. 8 to 10.

The pair of vertical guides 130 are coupled to both ends of the transferring block 192 and both front sides of the fixed block 191, respectively. The pair of vertical guides 130 connect the transferring block 192 to the fixed block 191 such that the transferring block 192 is movable in the vertical direction. The pair of vertical guides 130 are disposed at both ends of the transferring block 192 to guide the transferring block 192 in the vertical direction.

The vertical guide 130 is a linear guide that guides in the vertical direction and is preferably a cross roller guide.

A detailed description of the vertical guide 130 will be described below with reference to FIGS. 11 and 12.

Figure 6:
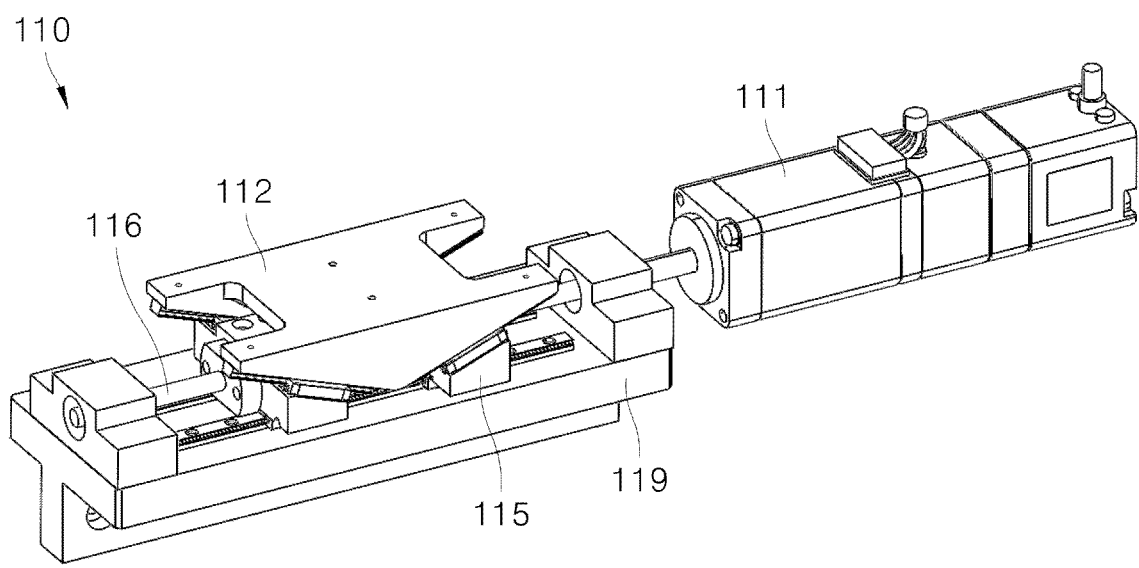
FIG. 6 is a perspective view of a wedge stage module of the apparatus for transferring the optical instrument according to an embodiment of the present invention.
Figure 6:
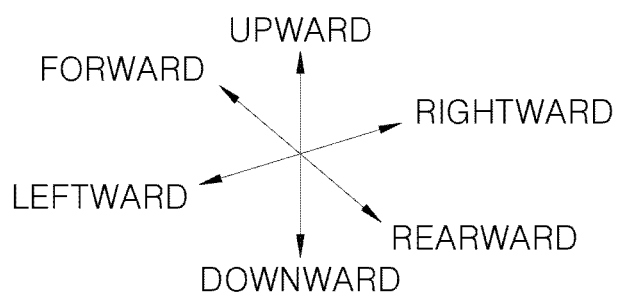
Figure 7:
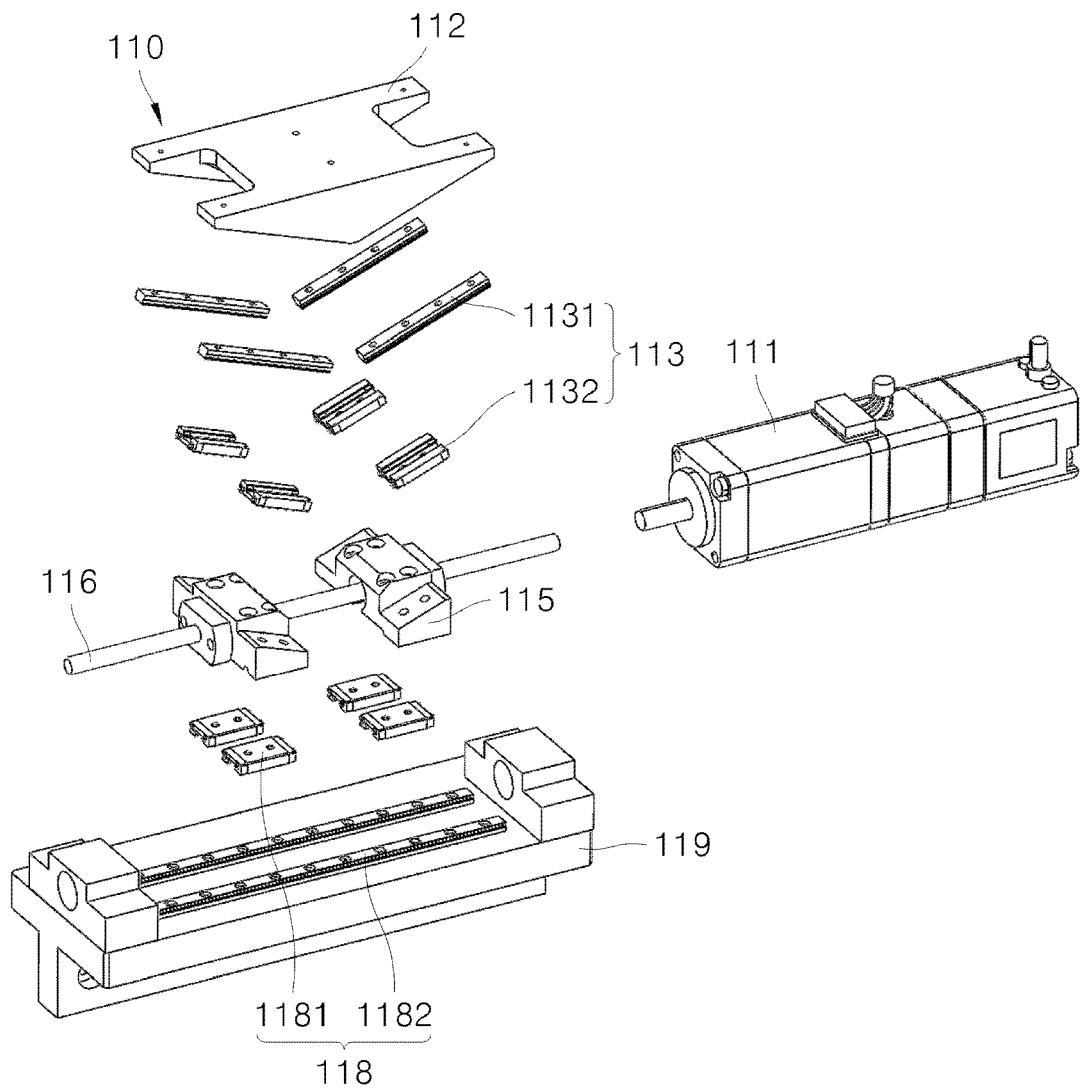
FIG. 7 is an exploded perspective view of the wedge stage module illustrated in FIG. 6.
Figure 7:
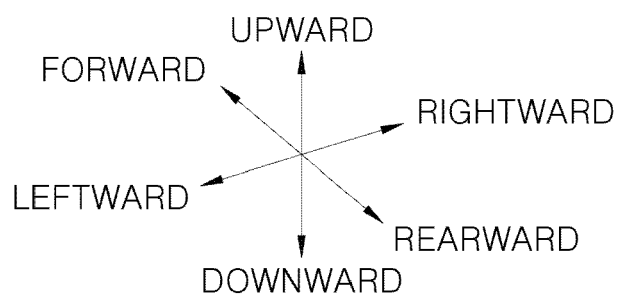

FIG. 6 is a perspective view of the wedge stage module of the apparatus for transferring the optical instrument according to an embodiment of the present invention, and FIG. 7 is an exploded perspective view of the wedge stage module illustrated in FIG. 6.

The wedge stage module 110 according to the embodiment of the present invention includes a motor 111 configured to provide a driving force, a ball screw 116 to rotate by the motor, a wedge block 112 coupled to the horizontal stage module 120 and having an inclined surface formed at a lower side thereof, a pair of ball nut blocks 115 each having an inclined surface formed at an upper side thereof to move in the horizontal direction by rotation of the ball screw 116 to move the wedge block 112 in the vertical direction, a plurality of wedge guides 113 to connect the wedge block 112 and the pair of ball nut blocks 115 to mutually slide, a wedge supporter 119 coupled to the fixed block 191 to support the pair of ball nut blocks 115 to be movable in the horizontal direction, and a plurality of supporter guides 118 to connect the wedge supporter 119 and the pair of ball nut blocks 115 to mutually slide.

The motor 111 is an electric motor that generates a rotational force when driven. A rotational shaft of the motor 111 is connected to the ball screw 116 to rotate the ball screw 116 when driven. The rotational shaft of the motor 111 is disposed in the horizontal direction. The rotational shaft of the motor 111 is disposed in a direction of both side ends (leftward and rightward directions) of the transferring block 192. The motor 111 is seated and coupled to any one of the pair of granite surface plate connectors 195. One of the pair of granite surface plate connectors 195 supports the motor 111.

The wedge block 112 is formed with a symmetrical "V" shaped inclined surface at a lower side thereof. The wedge block 112 is slidably connected to the pair of ball nut blocks 115 by the plurality of wedge guides 113. The wedge block 112 is connected to the pair of ball nut blocks 115 such that the wedge block 112 is movable in the vertical direction. The wedge block 112 moves in the vertical direction by the pair of ball nut blocks 115 when the motor 111 is driven.

An upper end of the wedge block 112 is coupled to the horizontal stage module 120. The wedge block 112 is coupled to the transferring block 192 by the horizontal stage module 120 and the block connector 197. When the wedge block 112 moves in the vertical direction by the driving of the motor 111, the transferring block 192 moves in the vertical direction.

The ball screw 116 is connected to the motor 111 and rotates when the motor 111 is driven. A thread is formed around the circumference of the ball screw 116. The ball screw 116 is fitted with the pair of ball nut blocks 115. The ball screw 116 may be any one of a return pipe type, a deflector type, and an end cap type.

It is preferred that the ball screw 116 is threaded oppositely corresponding to each of the pair of ball nut blocks 115 so that the pair of ball nut blocks 115 may move in different directions when the ball screw 116 rotates.

The ball screw 116 changes a rotational motion of the motor 111 into a linear motion together with the pair of ball nut blocks 115. The ball screw 116 moves the pair of ball nut blocks 115 closer to each other when rotating in one direction, and moves the pair of ball nut blocks 115 away from each other when rotating in the other direction.

The pair of ball nut blocks 115 are fitted to the ball screw 116 and move in the horizontal direction when the ball screw 116 rotates. The pair of ball nut blocks 115 move away from each other or closer to each other when the motor 111 is driven.

The pair of ball nut blocks 115 each have an inclined surface formed at an upper side thereof. The pair of ball nut blocks 115 are disposed symmetrically with respect to each other, corresponding to the 'V' shaped inclined surface of the wedge block 112. The pair of ball nut blocks 115 are disposed in a direction in which the inclined surfaces are mutually lowered.

The pair of ball nut blocks 115 are slidably connected to the wedge block 112 by the plurality of wedge guides 113. The pair of ball nut blocks 115 move the wedge block 112 in the vertical direction when the motor 111 is driven. The pair of ball nut blocks 115 change a linear motion in the horizontal direction to a linear motion in the vertical direction together with the wedge block 112 to move the transferring block 192 in the vertical direction.

The pair of ball nut blocks 115 are slidably connected to the wedge supporter 119 by the plurality of supporter guides 118. The pair of ball nut blocks 115 are connected to the wedge supporter 119 to be movable in the horizontal direction.

The wedge supporter 119 is coupled to the recessed portion of the upper end of the fixed block 191. The wedge supporter 119 has a step formed at a lower end thereof to be in close contact with the fixed block 191 on at least two surfaces. The step of the lower end of the wedge supporter 119 is in close contact with the upper and rear surfaces of the fixed block 191.

The plurality of supporter guides 118 are coupled to an upper side of the wedge supporter 119. The wedge supporter 119 has holes through which the ball screw 116 passes through at both ends. The wedge supporter 119 is coupled to the fixed block 191 to support the ball screw 116, the pair of ball nut blocks 115, and the wedge block 112.

The plurality of wedge guides 113 slidably couple the wedge block 112 and the pair of ball nut blocks 115. Each of the plurality of wedge guides 113 is a linear guide and is preferably a linear motion guide (LM guide).

The plurality of wedge guides 113 include a plurality of first wedge rails 1131 coupled to the 'V' shaped inclined surface of the wedge block 112, and a plurality of second wedge rails 1132 each fitted with the plurality of first wedge rails 1131 to mutually slide and coupled to an upper inclined surface of the ball nut block 115.

The plurality of supporter guides 118 slidably couple the pair of ball nut blocks 115 and the wedge supporter 119. Each of the plurality of supporter guides 118 is a linear guide and is preferably a linear motion guide (LM guide).

The plurality of supporter guides 118 include a plurality of first supporter rails 1181 coupled to lower surfaces of the pair of ball nut blocks 115, and a plurality of second supporter rails 1182 each fitted with the plurality of first supporter rails 1181 to mutually slide and coupled to an upper surface of the wedge supporter 119.

Figure 8:
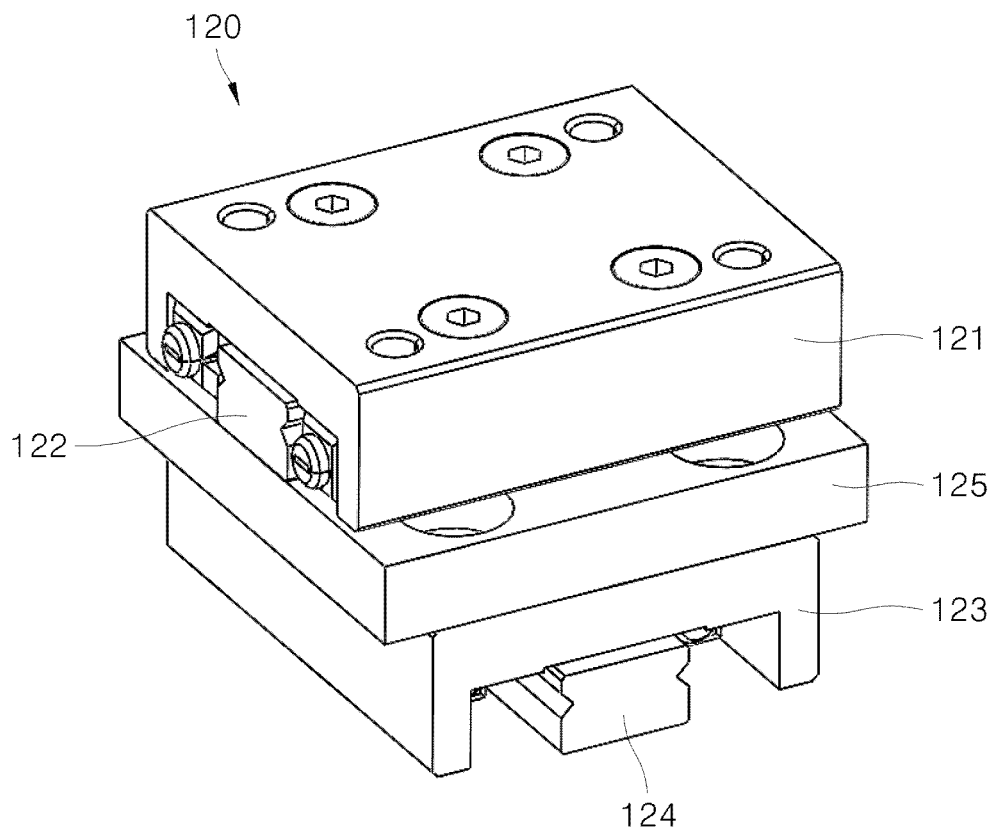
FIG. 8 is a perspective view of a horizontal stage module of the apparatus for transferring the optical instrument according to an embodiment of the present invention.
Figure 8:
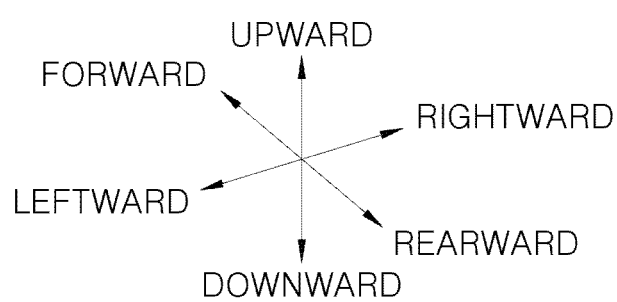
Figure 9:
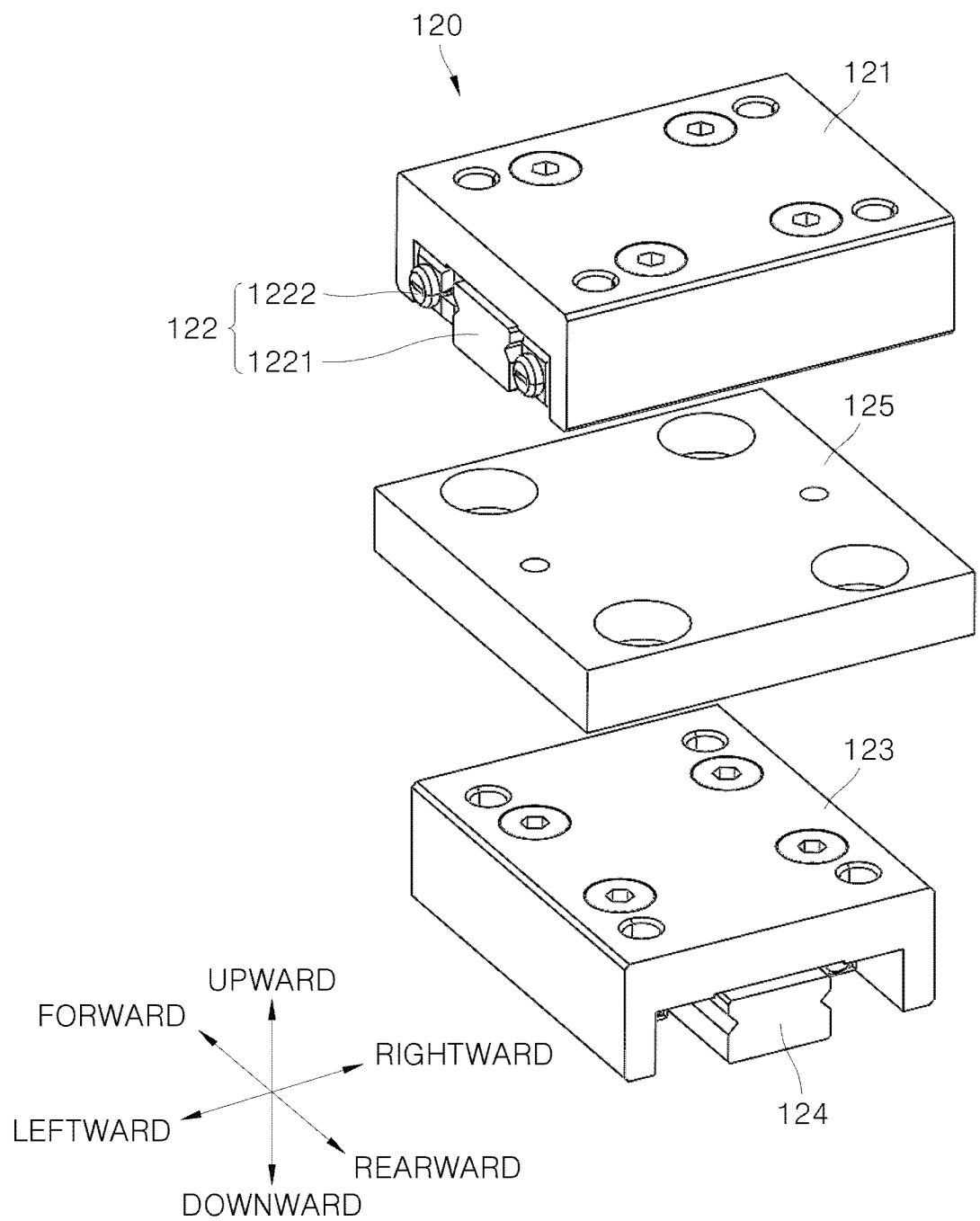
FIG. 9 is an exploded perspective view of the horizontal stage module illustrated in FIG. 8.
Figure 10:
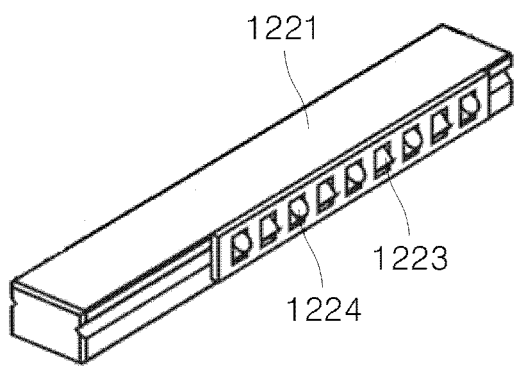
FIG. 10 is a partial perspective view of an upper guide of the horizontal stage module illustrated in FIG. 8.
Figure 10:
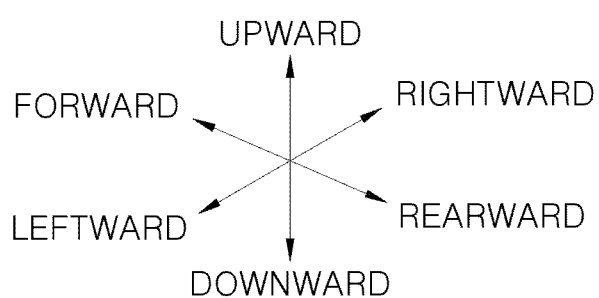

FIG. 8 is a perspective view of the horizontal stage module of the apparatus for transferring the optical instrument according to an embodiment of the present invention, FIG. 9 is an exploded perspective view of the horizontal stage module illustrated in FIG. 8, and FIG. 10 is a partial perspective view of an upper guide of the horizontal stage module illustrated in FIG. 8.

The horizontal stage module 120 according to the embodiment of the present invention includes a first stage block 121 coupled to the block connector 197, an upper guide 122 coupled to the first stage block 121, a second stage block 125 disposed on a lower side of the first stage block 121 and coupled to the upper guide 122, a third stage block 123 coupled to a lower side of the second stage block 125, and a lower guide 124 coupled to the third stage block 123 and the wedge block 112 and guiding in a direction orthogonal to a direction in which the upper guide guides.

The first stage block 121 is connected to the transferring block 192 by the block connector 197. An upper end of the first stage block 121 is coupled to a lower side of the protruding portion of the block connector 197. The first stage block 121 is slidably coupled to the second stage block 125 by the upper guide 122. The lower side of the first stage block 121 is coupled to the upper guide 122.

The upper guide 122 is connected to the transferring block 192 to guide the transferring block 192 in the leftward and rightward directions. The upper guide 122 offsets a load in the leftward and rightward directions to prevent the transferring block 192 from being moving in the leftward and rightward directions, rotating about an axis in the forward and rearward directions (rolling), or rotating about an axis in the upward and downward directions (yawing).

The upper guide 122 is a linear guide that guides in the horizontal direction and is preferably a cross roller guide. The upper guide 122 includes a first upper rail 1222 coupled to the first stage block 121, a second upper rail 1221 coupled to the second stage block 125, a plurality of first upper rollers 1223 having rotational axes disposed to be inclined forward in the vertical direction, and a plurality of second upper rollers 1224 having rotational axes disposed to be inclined rearward in the vertical direction.

The first upper rail 1222 and the second upper rail 1221 have a rolling surface formed with an elongated "V" groove in the leftward and rightward directions. The plurality of first upper rollers 1223 and the plurality of second upper rollers 1224 are disposed such that the rotational axes are orthogonal to each other.

The second stage block 125 is slidably coupled to the first stage block 121 by the upper guide 122. The second stage block 125 is fixedly coupled to the third stage block 123.

An upper end of the third stage block 123 is coupled to the second stage block 125. The third stage block 123 is slidably coupled to the wedge stage module 110 by the lower guide 124. A lower side of the third stage block 123 is coupled to the lower guide 124.

The lower guide 124 guides in a direction orthogonal to a direction in which the upper guide 122 guides. The lower guide 124 is connected to the transferring block 192 to guide the transferring block 192 in the forward and rearward directions. The lower guide 124 offsets a load in the forward and rearward directions to prevent the transferring block 192 from moving in the forward and rearward directions, rotating about an axis in the leftward and rightward directions (pitching), or rotating about an axis in the upward and downward directions (yawing).

The lower guide 124 is a linear guide that guides in the horizontal direction and is preferably a cross roller guide. Like the upper guide 122 described above, the lower guide 124 includes a first lower rail (not illustrated), a second lower rail (not illustrated), a plurality of first lower rollers (not illustrated), and a plurality of second lower rollers (not illustrated).

In the embodiment described above, the upper guide 122 is described as guiding the leftward and rightward directions and the lower guide 124 is described as guiding the forward and rearward directions, but the upper guide 122 may be disposed to guide the forward and rearward directions and the lower guide 124 may be disposed to guide the leftward and rightward directions.

In addition, according to the embodiment, the second stage block 125 may be omitted, and the upper guide 122 may slidably couple the first stage block 121 and the third stage block 123.

Figure 11:
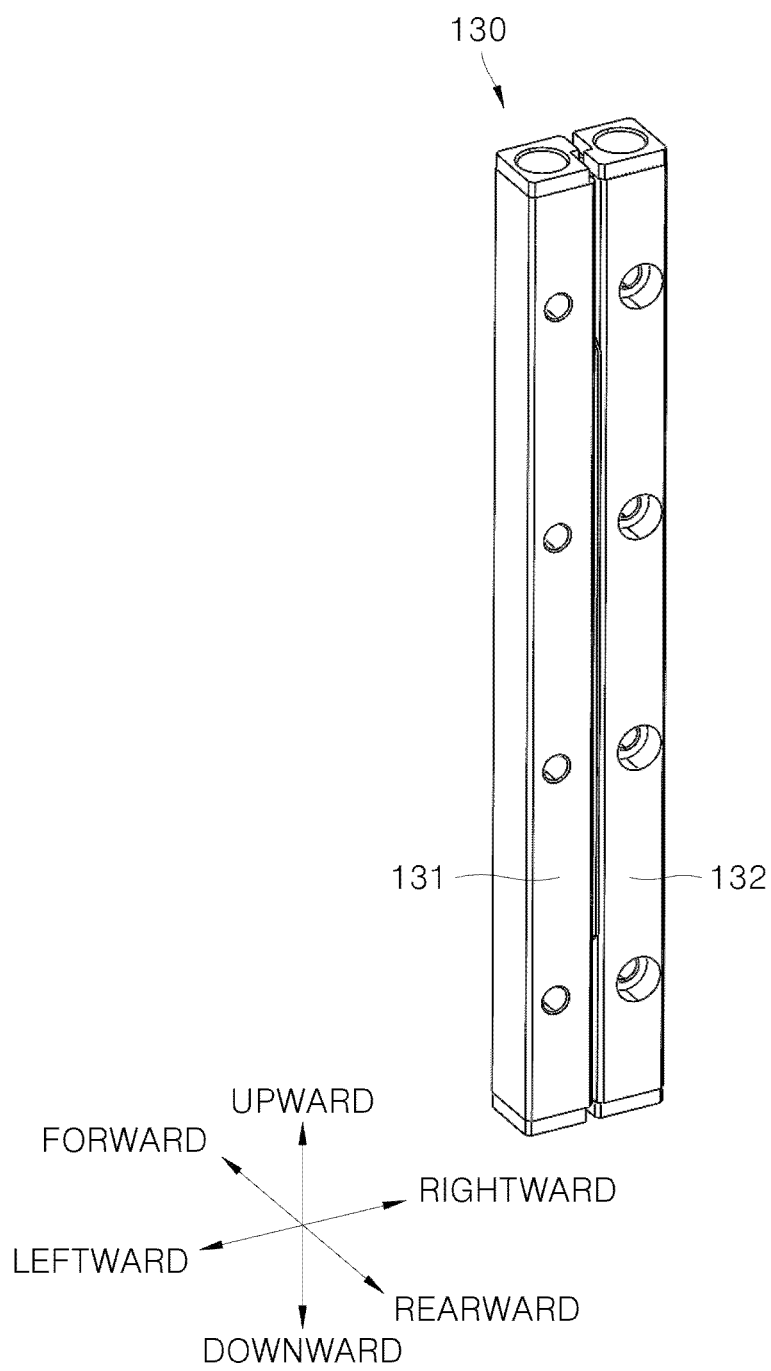
FIG. 11 is a perspective view of a vertical guide of the apparatus for transferring the optical instrument according to an embodiment of the present invention.
Figure 12:
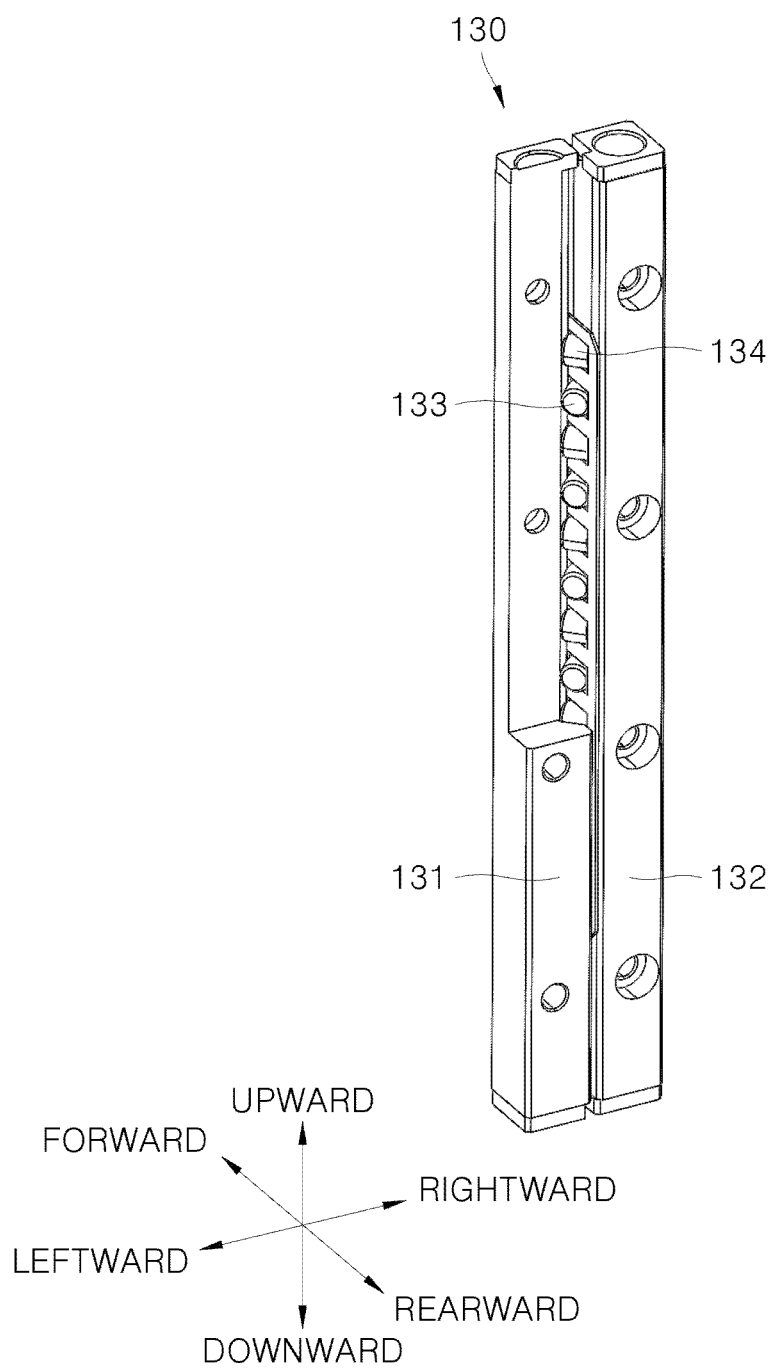
FIG. 12 is a cut-away perspective view of the vertical guide illustrated in FIG. 11.

FIG. 11 is a perspective view of the vertical guide of the apparatus for transferring the optical instrument according to an embodiment of the present invention, and FIG. 12 is a cut-away perspective view of the vertical guide illustrated in FIG. 11.

The vertical guide 130 according to the embodiment of the present invention includes a moving rail 132 coupled to a side end of the transferring block 192 and elongated in the vertical direction, a fixed rail 131 coupled to the fixed block 191 and elongated in the vertical direction, and a plurality of cross rollers 133 and 134 having rotational axes disposed in the horizontal direction and adjacent pairs of the rotational axes are orthogonal to each other.

The moving rail 132 has a rolling surface formed with an elongated "V" groove in the vertical direction. The moving rail 132 is disposed to be elongated in the vertical direction. The moving rail 132 has two surfaces in close contact with a step formed long in the vertical direction at a side end of the transferring block 192. The surface of the moving rail 132 in close contact with the transferring block 192 is neither parallel nor perpendicular to the rotational axis of any one of the plurality of cross rollers 133 and 134.

The fixed rail 131 has a rolling surface formed with an elongated "V" groove in the vertical direction. The fixed rail 131 is disposed to be elongated in the vertical direction. The fixed rail 131 has two surfaces in close contact with a step formed long in the vertical direction at both front surfaces of the fixed block 191. The surface of the fixed rail 131 in close contact with the fixed block 191 is neither parallel nor perpendicular to the rotational axis of any one of the plurality of cross rollers 133 and 134.

The plurality of cross rollers 133 and 134 are disposed on rolling surfaces formed in a 'V' shape on the fixed rail 131 and the moving rail 132. The plurality of cross rollers 133 and 134 include a plurality of first cross rollers 133 having rotational axes disposed obliquely to the right side in the forward and rearward directions, and a plurality of second cross rollers 134 having rotational axes disposed obliquely to the left side in the forward and rearward directions. The plurality of first cross rollers 133 and the plurality of second cross rollers 134 are disposed to cross each other one by one in the vertical direction.

It is preferable that the direction in which the horizontal stage module 120 guides does not coincide with the rotational axis of any one of the plurality of cross rollers 133 and 134. The rotational axes of the plurality of cross rollers 133 and 134 are disposed obliquely in a direction between the forward and rearward directions and the leftward and rightward directions, which does not coincide with the forward and rearward directions and the leftward and rightward directions, which are directions guided by the horizontal stage module 120. Therefore, the horizontal stage module 120 merely relieves a horizontal load caused by the vertical guide 130 and does not cause any yawing.

An operation of the apparatus for transferring the optical instrument according to the embodiment of the present invention, which is configured as described above, is described as follows.

When the motor 111 is driven to rotate the ball screw 116 in one direction, the pair of ball nut blocks 115 slide by the supporter guide 118 and move horizontally in a direction that is closer to each other. As the pair of ball nut blocks 115 move closer to each other, the wedge block 112 slides by the wedge guide 113 and moves upward. When the wedge block 112 moves upward, the transferring block 192, which is connected to the wedge block 112 by the horizontal stage module 120 and the block connector 197, moves upward. The transferring block 192 moves only in the vertical direction with respect to the fixed block 191 by the vertical guide 130. When the transferring block 192 moves upward, the optical instrument 10 fixed to the transferring block 192 moves upward.

When the motor 111 is driven to rotate the ball screw 116 in the other direction, the pair of ball nut blocks 115 slide by the supporter guide 118 and move horizontally in a direction away from each other. As the pair of ball nut blocks 115 move away from each other, the wedge block 112 slides by the wedge guide 113 and moves downward. When the wedge block 112 moves downward, the transferring block 192, which is connected to the wedge block 112 by the horizontal stage module 120 and the block connector 197, moves downward. When the transferring block 192 moves downward, the optical instrument 10 fixed to the transferring block 192 moves downward.

When the transferring block 192 moves in the vertical direction, the horizontal stage module 120 relieves a load caused by a repulsive force, a thrust, or a vibration generated from the vertical guide 130 and/or the wedge stage module 110.

While the exemplary embodiments of the present invention have been illustrated and described above, the present invention is not limited to the specific exemplary embodiments, and various modifications can of course be made by those skilled in the art to which the present invention pertains without departing from the subject matter of the present invention as claimed in the claims. Further, the modifications should not be appreciated individually from the technical spirit or prospect of the present invention.

The invention claimed is:

1. An apparatus for transferring an optical instrument, comprising:
   a transferring block, wherein the optical instrument is coupled to a front surface thereof;
   a fixed block disposed at a rear side of the transferring block and coupled to a granite surface plate;
   a wedge stage module disposed on the fixed block to move the transferring block in a vertical direction;
   a vertical guide disposed at a side end of the transferring block to guide the transferring block in the vertical direction; and
   a horizontal stage module connected between the wedge stage module and the transferring block to give a degrees of freedom in a horizontal direction,
   wherein the horizontal stage module gives the transferring block two degrees of freedom orthogonal to each other,
   wherein the vertical guide comprises a plurality of cross rollers having rotational axes disposed in the horizontal direction, and adjacent pairs of the rotational axes are orthogonal to each other,
   wherein any direction of the two degrees of freedom given by the horizontal stage module does not coincide with the rotational axis of any one of the plurality of cross rollers.

2. The apparatus of claim 1, wherein the wedge stage module is disposed at a rear side of the fixed block.

3. The apparatus of claim 2, wherein the wedge stage module is disposed at an upper side of the granite surface plate.

4. The apparatus of claim 1, wherein the wedge stage module comprises:
   a motor configured to provide a driving force;
   a ball screw rotated by the motor;
   a wedge block coupled to the horizontal stage module and having an inclined surface formed at a lower side thereof; and
   a ball nut block having an inclined surface formed at an upper side thereof and to move in the horizontal direction by rotation of the ball screw to move the wedge block in the vertical direction.

5. The apparatus of claim 4, wherein the wedge block has a symmetrical V-shaped inclined surface formed at a lower side thereof,
   the ball nut block is provided as a pair of ball nut blocks, and
   the pair of ball nut blocks are disposed symmetrically to each other corresponding to the V-shaped inclined surface of the wedge block.

6. The apparatus of claim 5, wherein the pair of ball nut blocks move away from each other or toward each other when the motor is driven.

7. The apparatus of claim 4, wherein the motor has a rotational shaft disposed in the horizontal direction and the rotational shaft of the motor is disposed in a direction of both side ends of the transferring block.

8. The apparatus of claim 5, wherein the wedge stage module further comprises a plurality of wedge guides to connect the wedge block and the pair of ball nut blocks to mutually slide.

9. The apparatus of claim 5, wherein the wedge stage module further comprises a wedge supporter coupled to the fixed block to support the pair of ball nut blocks to be movable in the horizontal direction.

10. The apparatus of claim 9, wherein the wedge stage module further comprises a plurality of supporter guides to connect the wedge supporter and the pair of ball nut blocks to mutually slide.

11. The apparatus of claim 9, wherein the wedge supporter is in close contact with the fixed block on at least two surfaces.

12. The apparatus of claim 4, further comprising a granite surface plate connector to couple the fixed block to the granite surface plate,
    wherein the motor is coupled to the granite surface plate connector.

13. The apparatus of claim 12, wherein the granite surface plate connector is coupled to a side end of the fixed block.

14. The apparatus of claim 1, wherein the vertical guide is provided as a pair of vertical guides, and
    the pair of vertical guides are disposed at both ends of the transferring block, respectively.

15. The apparatus of claim 1, wherein the vertical guide further comprises: a moving rail coupled to a side end of the transferring block and elongated in the vertical direction; and
    a fixed rail coupled to the fixed block and elongated in the vertical direction, and
    the plurality of cross rollers are disposed between the moving rail and the fixed rail.

16. The apparatus of claim 15, wherein the transferring block has a vertically elongated step formed to be in close contact with the moving rail on at least two surfaces.

17. The apparatus of claim 16, wherein the moving rail has a surface in close contact with the transferring block that is neither parallel nor perpendicular to the rotational axis of any one of the plurality of cross rollers.

18. The apparatus of claim 15, wherein the fixed block has a vertically elongated step formed to be in close contact with the fixed rail on at least two surfaces.

19. The apparatus of claim 18, wherein the fixed block has a surface in close contact with the moving rail that is neither parallel nor perpendicular to the rotational axis of any one of the plurality of cross rollers.

20. The apparatus of claim 1, wherein the horizontal stage module comprises: an upper guide connected to the transferring block; and
    a lower guide connected to the wedge stage module to guide in a direction orthogonal to a direction in which the upper guide guides.

21. The apparatus of claim 20, wherein the upper guide guides in leftward and rightward directions, which are directions of both side ends of the transferring block, and the lower guide guides in forward and rearward directions.

22. The apparatus of claim 1, wherein the horizontal stage module offsets a force to rotate the transferring block or move the transferring block in the horizontal direction.

23. The apparatus of claim 1, further comprising a block connector coupled to an upper end of the transferring block and disposed to protrude rearward,
    wherein the horizontal stage module is coupled to a lower side of a protruding portion of the block connector.

24. The apparatus of claim 23, wherein the horizontal stage module comprises:
    a first stage block coupled to the block connector;
    an upper guide coupled to the first stage block;
    a second stage block disposed on a lower side of the first stage block and coupled to the upper guide;
    a third stage block coupled to a lower side of the second stage block; and a lower guide coupled to the third stage block and the wedge stage module to guide in a direction orthogonal to a direction in which the upper guide guides.

\* \* \* \* \*